(12) United States Patent
Shacter

(10) Patent No.: US 6,316,978 B1
(45) Date of Patent: Nov. 13, 2001

(54) COMPARATOR WITH PROCESS AND TEMPERATURE INSENSITIVE HYSTERESIS AND THRESHOLD POTENTIALS

(75) Inventor: Stuart B. Shacter, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/563,488

(22) Filed: May 3, 2000

(51) Int. Cl.[7] .................................................. H03K 3/037
(52) U.S. Cl. ................................ 327/205; 327/67; 327/87
(58) Field of Search .............................. 327/205, 66, 65, 327/63, 77, 67, 72, 73, 87, 88, 206

(56) References Cited

U.S. PATENT DOCUMENTS

| | | | |
|---|---|---|---|
| 4,527,076 | * 7/1985 | Matsuo | 327/88 |
| 4,926,068 | * 5/1990 | Fujita | 327/72 |
| 5,266,884 | * 11/1993 | Agiman | 323/284 |
| 5,319,265 | 6/1994 | Lim | 327/73 |
| 5,362,994 | 11/1994 | Lin | 327/72 |
| 5,420,530 | * 5/1995 | Mita | 327/74 |
| 5,563,534 | 10/1996 | Rossi et al. | 327/77 |
| 5,798,663 | * 8/1998 | Fugere et al. | 327/205 |
| 5,894,234 | * 4/1999 | Morris | 327/65 |
| 5,914,630 | * 6/1999 | Peterson | 327/513 |
| 5,945,852 | 8/1999 | Kosiec | 327/68 |
| 6,028,456 | * 2/2000 | Littlefield | 327/74 |

* cited by examiner

Primary Examiner—Timothy P. Callahan
Assistant Examiner—Hai L. Nguyen
(74) Attorney, Agent, or Firm—Girard & Equitz LLP

(57) ABSTRACT

A comparator circuit having a first state and a second state, a threshold potential for transition from the first state to the second state, another threshold potential for transition from the second state to the first state, and hysteresis characteristics that are independent of process, temperature, and supply voltage variations. Preferably, the threshold potentials and hysteresis characteristics depend only on a reference potential and on ratios of resistances of pairs of resistors. In some embodiments, the circuit asserts an output signal in response to an input potential and a reference potential, and includes a comparator (having an output which asserts a binary output signal and two comparator inputs) and additional circuitry coupled to the comparator inputs and coupled to receive the input potential, the additional circuitry including a set of resistors and a current source, the current source is coupled to the output and configured to draw a first current when the output signal has its first value and a second current when the output signal has its second value, the current source includes a second set of resistors and is coupled to receive the reference potential, and the current source is implemented so that each of the first current and the second current is independent of all parameters other than the reference potential and a resistance of each resistor of the second set of resistors.

16 Claims, 3 Drawing Sheets

$I = 0$ when $V_O$ is high
$I = I_0$ when $V_O$ is low

COMPARATOR WITH PROCESS AND TEMPERATURE INSENSITIVE HYSTERESIS AND THRESHOLD POTENTIALS

BACKGROUND OF THE INVENTION

1. Field of the Invention

The invention pertains to comparators whose threshold potentials are independent of process and temperature variations. In preferred embodiments, the invention is a comparator whose hysteresis characteristics and threshold potentials are independent of process, temperature, and supply voltage variations, and depend only on a reference potential and on ratios of resistances of pairs of resistors.

2. Description of the Related Art

FIG. 1 is a schematic diagram of a conventional comparator circuit, which is typically implemented as an integrated circuit (or portion of an integrated circuit). In FIG. 1, voltage source 6 maintains the inverting input of comparator 8 at reference voltage $V_{ref}$ above ground. Resistor R3 is connected between the output and noninverting input of comparator 8. Resistor R1 is connected between the circuit's input node (which is maintained at input potential $V_{in}$) and comparator 8's noninverting input, and resistor R2 is connected between comparator 8's noninverting input and ground.

Comparator 8 has two states: a first state (in which its output potential $V_o$ has a first value $V_o = V_{oL}$), which it enters when the potential at it's noninverting input falls below a first threshold potential; and a second state (in which its output potential $V_o$ has a second value $V_o = V_{oH}$), which it enters when the potential at it's noninverting input rises to a second threshold potential. The FIG. 1 circuit is subject to hysteresis in the sense that the first threshold potential differs from the second threshold potential. Specifically, the second threshold potential is:

$$V_{LH} = V_{in} = V_{ref}(1 + R1/R2 + R1/R3) - V_{oL}(R1/R3);$$

and the first threshold potential is:

$$V_{HL} = V_{in} = V_{ref}(1 + R1/R2 + R1/R3) - V_{oH}(R1/R3).$$

Since the threshold potentials $V_{LH}$ and $V_{HL}$ depend on comparator 8's output potential (which is either $V_{oH}$ or $V_{oL}$), they typically depend on process variations (which occur during manufacture of the FIG. 1 circuit), temperature variations (which occur during operation of the FIG. 1 circuit), and variations in the supply potential (potential $V_s$ provided to comparator 8). The hysteresis characteristics of the FIG. 1 circuit similarly depend on comparator 8's output potential ($V_{oH}$ or $V_{oL}$), and thus also typically depends on process, temperature, and supply potential variations. It is impractical (and very difficult) to design an implementation of the FIG. 1 circuit in which neither the threshold potentials nor the hysteresis characteristics depend on process, temperature, or supply potential variations.

SUMMARY OF THE INVENTION

In a class of embodiments, the invention is a comparator circuit having a first state and a second state, a threshold potential for transition from the first state to the second state, another threshold potential for transition from the second state to the first state, and hysteresis characteristics that are independent of process, temperature, and supply voltage variations. In preferred embodiments, the threshold potentials and hysteresis characteristics depend only on a reference potential asserted to the circuit and on ratios of resistances of pairs of resistors of the circuit. In some of the preferred embodiments, the circuit asserts an output signal in response to an input potential and the reference potential, and includes a comparator (having an output which asserts a binary output signal, and two comparator inputs) and additional circuitry coupled to the comparator inputs and coupled to receive the input potential, wherein the additional circuitry includes a set of resistors and a current source, the current source is coupled to the output and configured to draw a first current when the output signal has its first value and to draw a second current when the output signal has its second value, the current source includes a second set of resistors and is coupled to receive the reference potential, and the current source is implemented so that each of the first current and the second current is independent of all parameters other than the reference potential and a resistance of each resistor of the second set of resistors.

In a first class of embodiments, the inventive circuit is coupled to receive an input potential, and configured to enter a first state (in which it asserts an output signal having a first value) in response to the input potential undergoing a transition in a first direction (a first one of a rising direction and a falling direction) to a first threshold potential, and to enter a second state (in which it asserts an output signal having a second value) in response to the input potential undergoing a transition in the opposite direction (the other one of the rising direction and the falling direction) to a second threshold potential. The circuit includes a comparator having a comparator output (at which the output signal is asserted) and two comparator inputs, and additional circuitry coupled to the comparator inputs and coupled to receive the input potential, wherein the additional circuitry includes a set of resistors and a current source, and the current source is coupled to the comparator output and configured to draw a first current when the output signal has the first value and to draw a second current when the output signal has the second value. In some of the embodiments in the first class, the first current is a nonzero current and the second current is zero (the first current has a nonzero amplitude and the second current has zero amplitude). In preferred ones of the first class of embodiments, the current source includes a second set of resistors and is coupled to receive a reference potential, and the current source is implemented so that the first current depends only on the reference potential and on a resistance of each resistor of the second set of resistors. In some of the preferred embodiments, the current source comprises a switch coupled to receive a signal indicative of the value of the inventive circuit's output signal, and current source circuitry having a first node coupled to the switch, wherein the current source circuitry includes the second set of resistors, at least one transistor coupled to the second set of resistors, a second node coupled to receive the reference potential, and a third node (coupled to said at least one transistor), wherein the current source circuitry has a first state in which said current source circuitry draws the first current from the third node and a second state in which said current source circuitry draws the second current from said third node.

In some of the first class of embodiments, the comparator inputs include a noninverting input and an inverting input, the additional circuitry includes a reference potential source, the set of resistors has a first node coupled to receive the input potential, a second node coupled to the current source, and a third node coupled to the noninverting input, and the reference potential source is coupled to the inverting input (so as to maintain the inverting input at a reference potential). In other ones of the first class of embodiments, the comparator inputs include a noninverting input and an inverting input, the additional circuitry includes first circuitry and second circuitry, the first circuitry includes a first subset of the set of resistors and has a first node coupled to receive the input potential and a second node coupled to the inverting input, the second circuitry includes a reference potential source, the current source, and a second subset of the set of resistors coupled between the reference potential source and the noninverting input, wherein the current source is also coupled to the noninverting input.

DETAILED DESCRIPTION OF PREFERRED EMBODIMENTS

Figure 1:
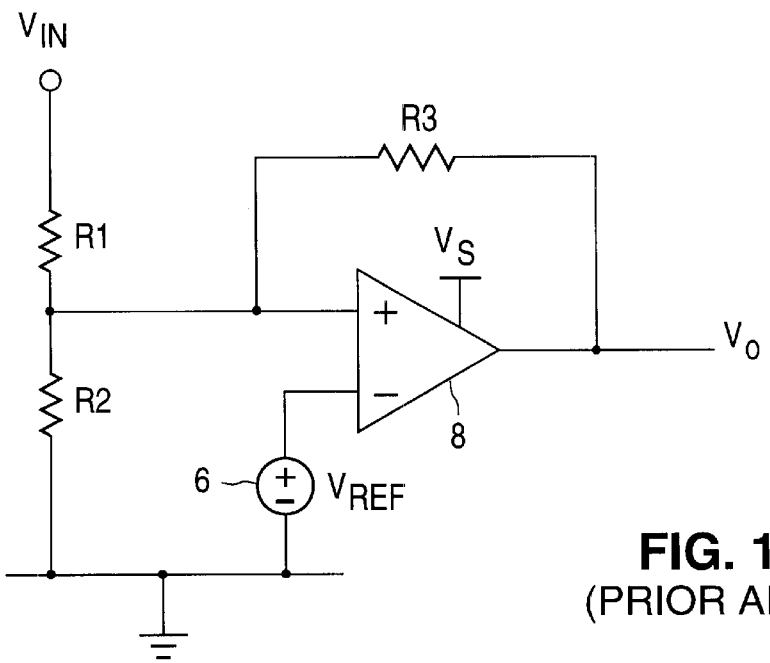
FIG. 1 is a schematic diagram of a conventional comparator circuit.
Figure 2:
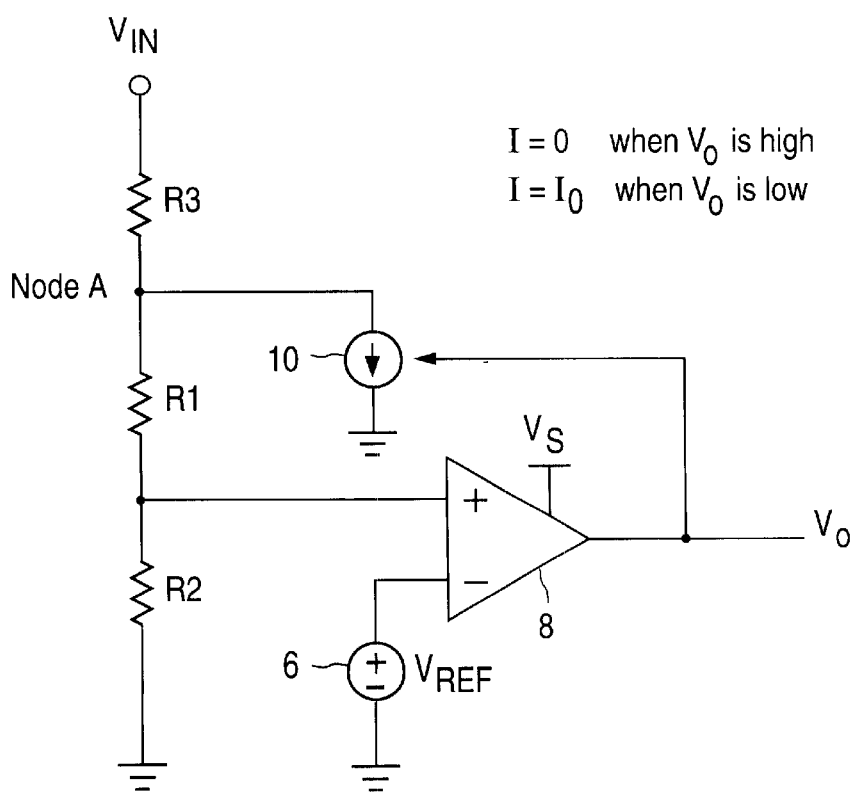
FIG. 2 is a schematic diagram of a preferred embodiment of the inventive comparator circuit.

The circuit of FIG. 2 is a preferred embodiment of the inventive comparator circuit, and is typically implemented as an integrated circuit (or portion of an integrated circuit). In FIG. 2, voltage source 6 maintains the inverting input of comparator 8 at reference voltage $V_{ref}$ above ground.

Comparator 8 has two states: a first state (in which its output potential $V_o$ has a first value $V_o=V_{oL}$), which it enters when input potential $V_{in}$ falls below a first threshold potential; and a second state (in which its output potential $V_o$ has a second value $V_o=V_{oH}$), which it enters when input potential $V_{in}$ rises to a second threshold potential. The output of comparator 8 is coupled to current source 10. Current source 10 enters a first state (in response to output potential $V_o$ having its low value $V_o=V_{oL}$) in which it sinks current $I_0$ to ground from node A, and enters a second state (in response to output potential $V_o$ having its high value $V_o=V_{oH}$) in which it sinks no current from node A.

Resistor R3 is connected between the circuit's input node (which is at input potential $V_{in}$) and node A, resistor R1 is connected between node A and the noninverting input of comparator 8, and resistor R2 is connected between the comparator's noninverting input and ground.

The FIG. 2 circuit is subject to hysteresis in the sense that the second threshold potential differs from the first threshold potential. Specifically, the second threshold potential (the threshold potential which triggers transition from the first state to the second state) is:

$$V_{LH}=V_{in}=V_{ref}(1+R1/R2+R3/R2)+I_0R3;$$

and the first threshold potential (the threshold potential which triggers transition from the second state to the first state) is:

$$V_{HL}=V_{in}=V_{ref}(1+R1/R2+R3/R2).$$

Figure 4:
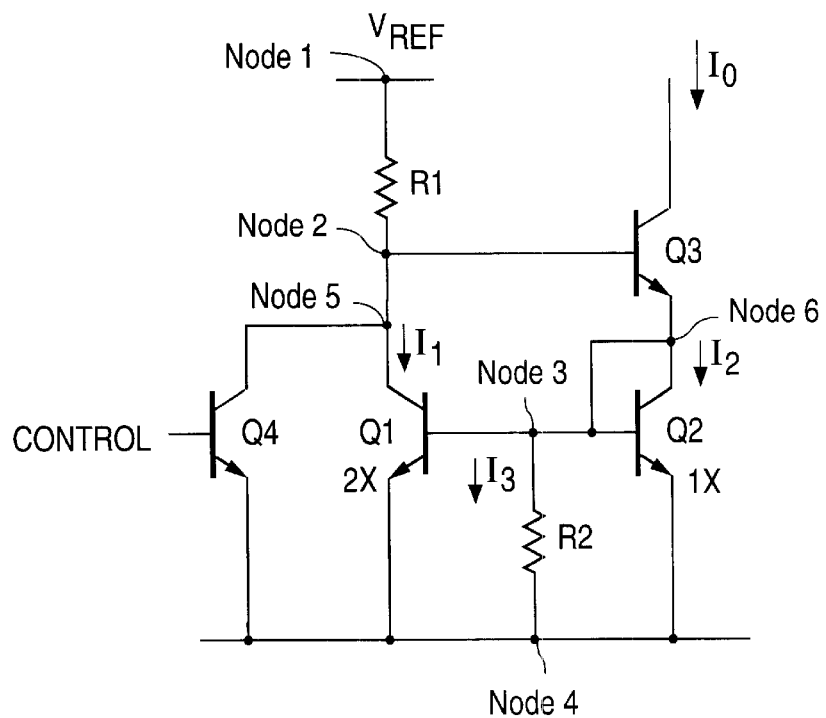
FIG. 4 is a schematic diagram of a preferred embodiment of current source 10 of the FIG. 2 circuit (or current source 12 of the FIG. 3 circuit).

The threshold potentials $V_{LH}$ and $V_{HL}$ do not depend on comparator 8's output potential. Current source 10 can be implemented (for example, as shown in FIG. 4) so that $I_0=V_{ref}/R$, where R is a fixed resistance. With current source 10 implemented so that $I_0=V_{ref}/R$, the threshold potentials and hysteresis characteristics of the FIG. 2 circuit depend only on reference potential $V_{ref}$ and on fixed resistance ratios (determined by resistors of the FIG. 2 circuit), and do not depend on process variations (which occur during manufacture of the FIG. 2 circuit), temperature variations (which occur during operation of the FIG. 2 circuit), or variations in the supply potential (potential $V_s$ provided to comparator 8).

Figure 3:
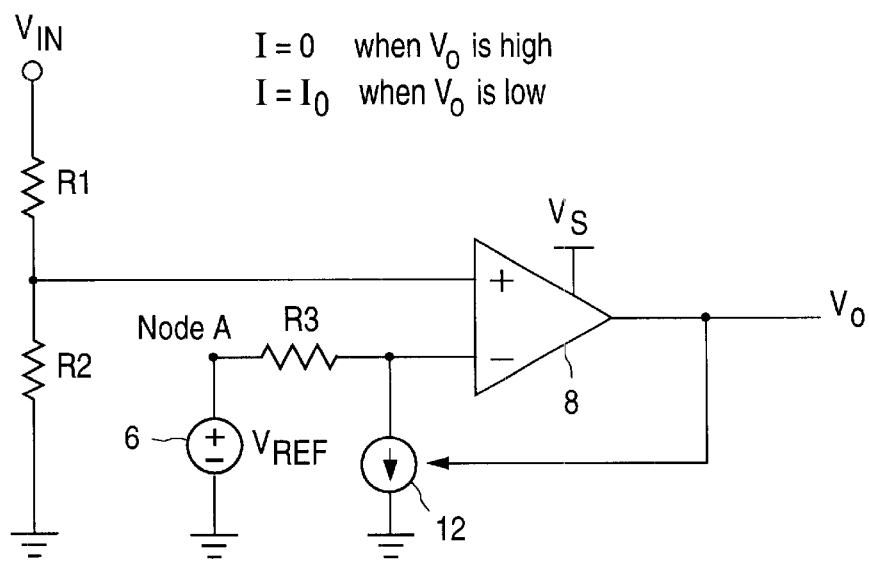
FIG. 3 is a schematic diagram of another preferred embodiment of the inventive comparator circuit.

FIG. 3 is a variation on the FIG. 2 embodiment of the invention. In FIG. 3, voltage source 6 maintains node A at reference voltage $V_{ref}$ above ground. Resistor R3 is coupled between node A and the noninverting input of comparator 8. Resistor R1 is connected between the circuit's input node (which is at input potential $V_{in}$) and the inverting input of comparator 8, and resistor R2 is connected between the comparator's inverting input and ground. Comparator 8 has two states: a first state (in which its output potential $V_o$ has a first value $V_o=V_{oL}$), which it enters when input potential $V_{in}$ rises above a first threshold potential; and a second state (in which its output potential $V_o$ has a second value $V_o=V_{oH}$), which it enters when input potential $V_{in}$ falls to a second threshold potential.

The output of comparator 8 is coupled to current source 12. Current source 12 enters a first state (in response to output potential $V_o$ having its low value $V_o=V_{oL}$) in which it sinks current $I_0$ to ground from node A, and enters a second state (in response to output potential $V_o$ having its high value $V_o=V_{oH}$) in which it sinks no current from node A.

The FIG. 3 circuit is subject to hysteresis in the sense that the second threshold potential differs from the first threshold potential. Specifically, the second threshold potential (the threshold potential which triggers transition from the first state to the second state) is:

$$V_{LH}=V_{in}=V_{ref}(1+R1/R2)-I_0R_3(1+R1/R2);$$

and the first threshold potential (the threshold potential which triggers transition from the second state to the first state) is:

$$V_{HL}=V_{in}=V_{ref}(1+R1/R2).$$

The threshold potentials $V_{LH}$ and $V_{HL}$ do not depend on comparator 8's output potential. Current source 12 can be implemented (for example, as shown in FIG. 4) so that $I_0=V_{ref}/R$, where R is a fixed resistance. With current source 12 implemented so that $I_0=V_{ref}/R$, the threshold potentials and hysteresis characteristics of the FIG. 3 circuit depend only on reference potential $V_{ref}$ and on fixed resistance ratios (determined by resistors of the FIG. 3 circuit), and do not depend on process variations, temperature variations, or variations in the supply potential (potential $V_s$ provided to comparator 8).

FIG. 4 is a schematic diagram of a preferred embodiment of current source 10 of the FIG. 2 circuit (or current source 12 of the FIG. 3 circuit), which comprises bipolar transistors Q1, Q2, Q3, and Q4 connected as shown, and resistors R1 and R2. Resistor R1 is connected between Nodes 1 and 2. Node 1 is held at above-mentioned reference potential $V_{ref}$ (e.g., the potential of Node A of FIG. 3). The collectors of transistors Q1 and Q4 and the base of transistor Q3 are connected together at Node 2. Resistor R2 is connected between Node 3 (which is the base of transistor Q1 and the common base and collector of transistor Q2), and Node 4 (the common emitters of transistors Q1, Q2, and Q4). The base of transistor Q4 is coupled to receive a signal ("CONTROL") which is indicative of the output of comparator 8.

In FIG. 4, resistors R1 and R2 have the same resistance (R1=R2=R) and the emitter area of Q1 is twice that of Q2. The current flowing from Node 5 to the collector of transistor Q1 is denoted "$I_1$," the current flowing from Node 6 to the collector of transistor Q2 is denoted "$I_2$," and the current flowing from Node 3 to resistor R2 is denoted "$I_3$."

When the output of comparator 8 is high ($V_o=V_{oH}$), the signal CONTROL turns on transistor Q4, which causes the current ($I_0$) through the collector of Q3 to fall to zero.

When the output of comparator 8 is low ($V_o=V_{oL}$), the signal CONTROL turns off transistor Q4, so that:

$$I_2=(V_{ref}-2V_{BE})/2R=I_1/2,$$

where $V_{BE}$ is the voltage between the base and emitter of transistor Q2;

$$I_3=V_{BE}/R;$$

and $$I_0=I_2+I_3=V_{ref}/2R.$$

Thus, in both states of the FIG. 4 circuit, current $I_0$ is independent of all parameters other than reference potential $V_{ref}$ and the resistances of the resistors of the FIG. 4 circuit.

Figure 5:
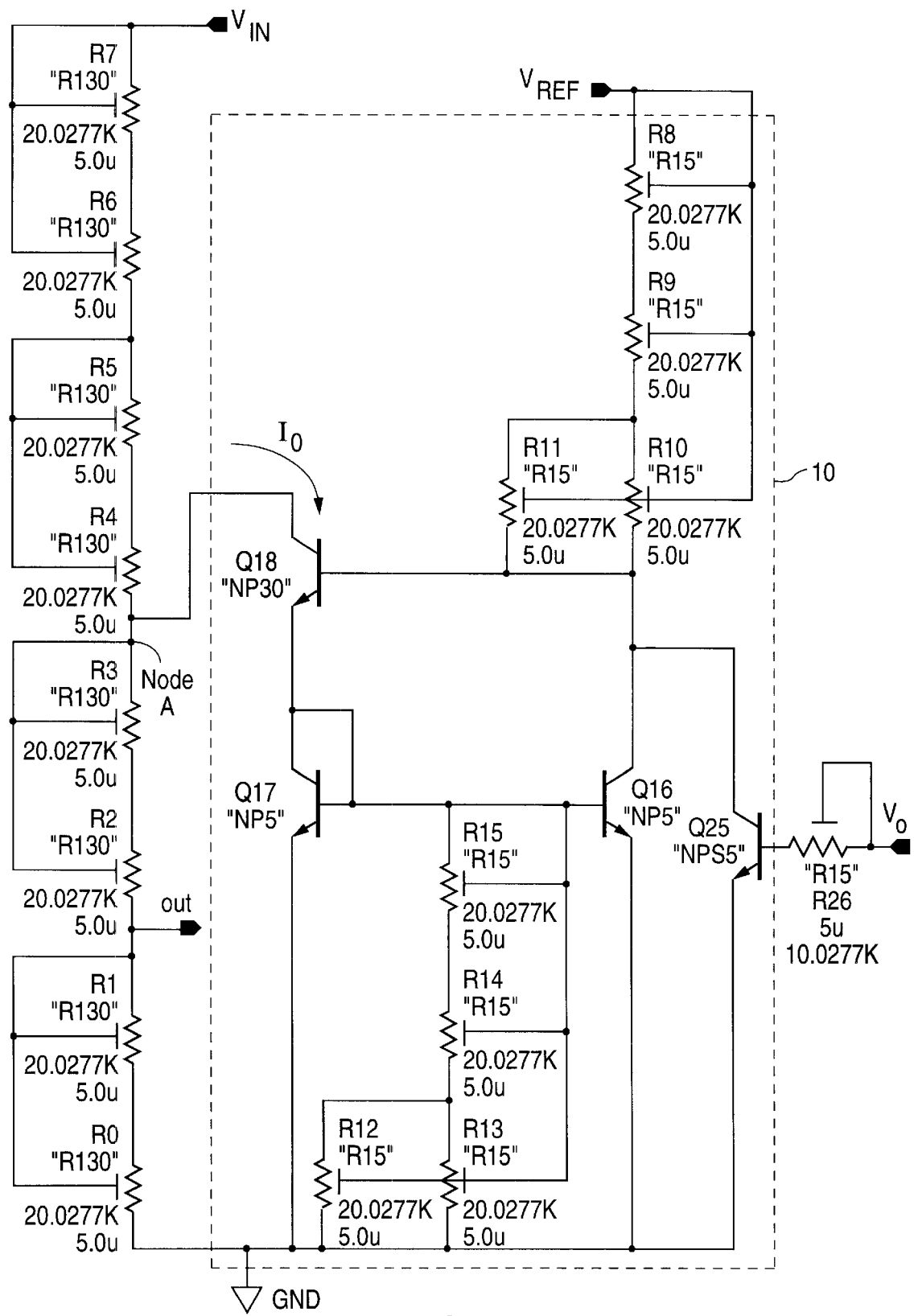
FIG. 5 is a schematic diagram of a preferred implementation of a portion of the FIG. 2 circuit.

FIG. 5 is a schematic diagram of a preferred implementation of a portion of the FIG. 2 circuit. Current source 10 of FIG. 5 is an implementation of current source 10 of FIG. 2, which is a variation on the FIG. 4 circuit. Output voltage $V_o$ of the comparator (corresponding to comparator 8, but not shown in FIG. 5) is asserted to one end of resistor R26. The other end of resistor R26 is coupled to the base of FIG. 5's bipolar transistor Q25 (which corresponds functionally to transistor Q4 of FIG. 4). Current source 10 of FIG. 5 draws current $I_0$ from Node A. Current $I_0$ is zero when the comparator is in the state in which voltage $V_o$ has a value which causes transistor Q25 to turn on. Current $I_0$ has a value which depends only on reference potential $V_{ref}$ and the resistances of resistors R8, R9, R10, R11, R12, R13, R14, and R15 (of current source 10) when the comparator is in its other state (in which voltage $V_o$ has a value which causes transistor Q25 to turn off).

In FIG. 5, series-connected resistors R4, R5, R6, and R7 correspond functionally to resistor R3 of FIG. 2, series-connected resistors R2 and R3 correspond functionally to resistor R1 of FIG. 2, series-connected resistors R0 and R1 correspond functionally to resistor R2 of FIG. 2, resistors R8, R9, R10, and R11 together correspond functionally to resistor R1 of FIG. 4, and resistors R12, R13, R14, and R15 correspond functionally to resistor R2 of FIG. 4. The node between resistors R1 and R2 (at which the FIG. 5 circuit produces output signal "out") is coupled to the noninverting input of the comparator (although the comparator is not shown in FIG. 5).

It should be understood that various alternatives to the structures described herein may be employed in practicing the present invention. It is intended that the following claims define the invention and that structures within the scope of these claims and their equivalents be covered thereby.

What is claimed is:

1. A comparator circuit having a first state and a second state, a threshold potential for transition from the first state to the second state, a second threshold potential for transition from the second state to the first state, and hysteresis characteristics that are independent of process, temperature, and supply voltage variations, wherein the comparator circuit asserts a binary output signal, whose value is one of a first value and a second value, in response to an input potential and a reference potential, said comparator circuit comprising:

a comparator having an output and two comparator inputs, wherein the comparator asserts the binary output signal at the output; and additional circuitry coupled to the comparator inputs and coupled to receive the input potential, and including resistors and a current source, wherein the current source includes a first subset of the resistors, a second subset of the resistors is not included in the current source, the current source is coupled to the output and configured to draw a first current when the output signal has the first value and to draw a second current when the output signal has the second value, and the current source is configured such that each of the first current and the second current is independent of all parameters other than the reference potential and a resistance of each resistor of the first subset of the resistors, so that each of the threshold potential and the second threshold potential depends only on the reference potential and on ratios of resistances of pairs of the resistors.

2. The comparator circuit of claim 1, wherein the current source is coupled to receive the reference potential and is configured so that the first current depends only on the reference potential and on resistances of all or some of the first subset of the resistors.

3. A comparator circuit having a first state and a second state, a threshold potential for transition from the first state to the second state, a second threshold potential for transition from the second state to the first state, and hysteresis characteristics that are independent of process, temperature, and supply voltage variations, wherein the comparator circuit asserts a binary output signal, whose value is one of a first value and a second value, in response to an input potential and a reference potential, said comparator circuit comprising:

a comparator having an output and two comparator inputs, wherein the comparator asserts the binary output signal at the output; and additional circuitry coupled to the comparator inputs and coupled to receive the input potential, and including resistors and a current source, wherein the current source includes a first subset of the resistors, a second subset of the resistors is not included in the current source, the current source is coupled to the output and configured to draw a first current when the output signal has the first value and to draw a second current when the output signal has the second value, and the current source is configured such that each of the first current and the second current is independent of all parameters other than the reference potential and a resistance of each resistor of the first subset of the resistors, so that each of the threshold potential and the second threshold potential depends only on the reference potential and on ratios of resistances of pairs of the resistors, wherein the current source is coupled to receive the reference potential and is configured so that the first current depends only on the reference potential and on resistances of all or some of the first subset of the resistors, and wherein the current source comprises:

a switch coupled to receive a binary signal indicative of the value of the output signal; and current source circuitry having a first node coupled to the switch, wherein the current source circuitry includes said first subset of the resistors, at least one transistor coupled to said first subset of the resistors, a second node coupled to receive the reference potential, and a third node coupled to said at least one transistor, wherein the current source circuitry has a first state in which said current source circuitry draws the first current from the third node and a second state in which said current source circuitry draws the second current from said third node.

4. The comparator circuit of claim 3, wherein the first current has a nonzero amplitude and the second current has zero amplitude.

5. A comparator circuit having a first state and a second state, a threshold potential for transition from the first state to the second state, a second threshold potential for transition from the second state to the first state, and hysteresis characteristics that are independent of process, temperature, and supply voltage variations, wherein the comparator circuit asserts a binary output signal, whose value is one of a first value and a second value, in response to an input potential and a reference potential, said comparator circuit comprising:

a comparator having an output and two comparator inputs, wherein the comparator asserts the binary output signal at the output; and additional circuitry coupled to the comparator inputs and coupled to receive the input potential, and including resistors and a current source, wherein the current source includes a first subset of the resistors, a second subset of the resistors is not included in the current source, the current source is coupled to the output and configured to draw a first current when the output signal has the first value and to draw a second current when the output signal has the second value, and the current source is configured such that each of the first current and the second current is independent of all parameters other than the reference potential and a resistance of each resistor of the first subset of the resistors, so that each of the threshold potential and the second threshold potential depends only on the reference potential and on ratios of resistances of pairs of the resistors, wherein the comparator inputs include a noninverting input and an inverting input, and the additional circuitry also includes:

a reference potential source, wherein the second subset of resistors has a first node coupled to receive the input potential, a second node coupled to the current source, and a third node coupled to the noninverting input, and the reference potential source is coupled to the inverting input so as to maintain said inverting input at the reference potential.

6. A comparator circuit having a first state and a second state, a threshold potential for transition from the first state to the second state, a second threshold potential for transition from the second state to the first state, and hysteresis characteristics that are independent of process, temperature, and supply voltage variations, wherein the comparator circuit asserts a binary output signal, whose value is one of a first value and a second value, in response to an input potential and a reference potential, said comparator circuit comprising:

a comparator having an output and two comparator inputs, wherein the comparator asserts the binary output signal at the output; and additional circuitry coupled to the comparator inputs and coupled to receive the input potential, and including resistors and a current source, wherein the current source includes a first subset of the resistors, a second subset of the resistors is not included in the current source, the current source is coupled to the output and configured to draw a first current when the output signal has the first value and to draw a second current when the output signal has the second value, and the current source is configured such that each of the first current and the second current is independent of all parameters other than the reference potential and a resistance of each resistor of the first subset of the resistors, so that each of the threshold potential and the second threshold potential depends only on the reference potential and on ratios of resistances of pairs of the resistors, wherein the comparator inputs include a noninverting input and an inverting input, and the additional circuitry also includes:

first circuitry, including at least one of the second subset of the resistors, and having a first node coupled to receive the input potential and a second node coupled to the inverting input; and second circuitry, including a voltage source, the current source, and at least one additional one of the second subset of the resistors, wherein the voltage source is coupled to a reference node so as to maintain the reference node at the reference potential, said at least one additional one of the second subset of the resistors is coupled between the reference node and the noninverting input, and the current source is also coupled to the noninverting input.

7. A comparator circuit coupled to receive an input potential and configured to assert a binary output signal in response to the input potential and a reference potential, wherein the comparator circuit is configured to enter a first state in which the output signal has a first value in response to the input potential undergoing a first one of a rising transition and a falling transition to a threshold potential, and to enter a second state in which the output signal has a second value in response to the input potential undergoing a second one of the rising transition and the falling transition to a second threshold potential, wherein each of the threshold potential and the second threshold potential is independent of process, temperature, and supply voltage variations, said comparator circuit comprising:

a comparator having an output at which the binary output signal is asserted, and two comparator inputs; and additional circuitry coupled to the comparator inputs and coupled to receive the input potential, wherein the additional circuitry includes resistors and a current source, the current source has a node at the reference potential and includes a first subset of the resistors but not a second subset of the resistors, the current source is coupled to the output and configured to draw a first current when the output signal has the first value and a second current when the output signal has the second value, and the current source is configured such that each of the first current and the second current is independent of all parameters other than the reference potential and resistances of all or some of the first subset of the resistors.

8. The comparator circuit of claim 7, wherein the additional circuitry is configured such that each of the threshold potential and the second threshold potential depends only on the reference potential and on ratios of resistances of pairs of the resistors.

9. The comparator circuit of claim 8, wherein the current source is configured so that the first current depends on the reference potential and on resistances of all or some of the first subset of the resistors.

10. The comparator circuit of claim 8, wherein the first current has nonzero amplitude and the second current has zero amplitude.

11. The comparator circuit of claim 7, wherein the current source is configured so that the first current depends on the reference potential and on resistances of all or some of the first subset of the resistors.

12. A comparator circuit coupled to receive an input potential and configured to assert a binary output signal in response to the input potential and a reference potential, wherein the comparator circuit is configured to enter a first state in which the output signal has a first value in response to the input potential undergoing a first one of a rising transition and a falling transition to a threshold potential, and to enter a second state in which the output signal has a second value in response to the input potential undergoing a second one of the rising transition and the falling transition to a second threshold potential, wherein each of the threshold potential and the second threshold potential is independent of process, temperature, and supply voltage variations, said comparator circuit comprising:

a comparator having an output at which the binary output signal is asserted, and two comparator inputs; and additional circuitry coupled to the comparator inputs and coupled to receive the input potential, wherein the additional circuitry includes resistors and a current source, the current source has a node at the reference potential and includes a first subset of the resistors but not a second subset of the resistors, the current source is coupled to the output and configured to draw a first current when the output signal has the first value and a second current when the output signal has the second value, and the current source is configured such that each of the first current and the second current is independent of all parameters other than the reference potential and resistances of all or some of the first subset of the resistors, wherein the current source comprises:

a switch coupled to receive a signal indicative of the value of the output signal; and current source circuitry having a first node coupled to the switch, wherein the current source circuitry includes the first subset of the resistors, at least one transistor coupled to the first subset of the resistors, a second node coupled to receive the reference potential, and a third node coupled to said at least one transistor, wherein the current source circuitry has a first state in which said current source circuitry draws the first current from the third node and a second state in which said current source circuitry draws the second current from said third node.

13. The comparator circuit of claim 12, wherein the switch is a bipolar transistor whose base is coupled to receive the signal indicative of the value of the output signal, and whose emitter and collector are coupled to the current source circuitry.

14. The comparator circuit of claim 12, wherein the first current has a nonzero amplitude and the second current has zero amplitude.

15. A comparator circuit coupled to receive an input potential and configured to assert a binary output signal in response to the input potential and a reference potential, wherein the comparator circuit is configured to enter a first state in which the output signal has a first value in response to the input potential undergoing a first one of a rising transition and a falling transition to a threshold potential, and to enter a second state in which the output signal has a second value in response to the input potential undergoing a second one of the rising transition and the falling transition to a second threshold potential, wherein each of the threshold potential and the second threshold potential is independent of process, temperature, and supply voltage variations, said comparator circuit comprising:

a comparator having an output at which the binary output signal is asserted, and two comparator inputs; and additional circuitry coupled to the comparator inputs and coupled to receive the input potential, wherein the additional circuitry includes resistors and a current source, the current source has a node at the reference potential and includes a first subset of the resistors but not a second subset of the resistors, the current source is coupled to the output and configured to draw a first current when the output signal has the first value and a second current when the output signal has the second value, and the current source is configured such that each of the first current and the second current is independent of all parameters other than the reference potential and resistances of all or some of the first subset of the resistors, wherein the comparator inputs include a noninverting input and an inverting input, and the additional circuitry also includes:

a reference potential source, wherein the second subset of the resistors has a first node coupled to receive the input potential, a second node coupled to the current source, and a third node coupled to the noninverting input, and the reference potential source is coupled to the inverting input so as to maintain said inverting input at the reference potential.

16. A comparator circuit coupled to receive an input potential and configured to assert a binary output signal in response to the input potential and a reference potential, wherein the comparator circuit is configured to enter a first state in which the output signal has a first value in response to the input potential undergoing a first one of a rising transition and a falling transition to a threshold potential, and to enter a second state in which the output signal has a second value in response to the input potential undergoing a second one of the rising transition and the falling transition to a second threshold potential, wherein each of the threshold potential and the second threshold potential is independent of process, temperature, and supply voltage variations, said comparator circuit comprising:

a comparator having an output at which the binary output signal is asserted, and two comparator inputs; and additional circuitry coupled to the comparator inputs and coupled to receive the input potential, wherein the additional circuitry includes resistors and a current source, the current source has a node at the reference potential and includes a first subset of the resistors but not a second subset of the resistors, the current source is coupled to the output and configured to draw a first current when the output signal has the first value and a second current when the output signal has the second value, and the current source is configured such that each of the first current and the second current is independent of all parameters other than the reference potential and resistances of all or some of the first subset of the resistors, wherein the comparator inputs include a noninverting input and an inverting input, and the additional circuitry also includes:

first circuitry, including at least one of the second subset of the resistors, and having a first node coupled to receive the input potential and a second node coupled to the inverting input; and second circuitry, including a voltage source, the current source, and at least one additional one of the second subset of the resistors, wherein the voltage source is coupled to a reference node so as to maintain the reference node at the reference potential, said at least one additional one of the second subset of the resistors is coupled between the reference node and the noninverting input, and the current source is also coupled to the noninverting input.

* * * * *